United States Patent
Boe

[11] Patent Number: 6,158,594
[45] Date of Patent: Dec. 12, 2000

[54] PRINTED CIRCUIT BOARD MOUNTING BRACKET

[75] Inventor: Craig L. Boe, Nampa, Id.

[73] Assignee: Micron Electronics, Inc., Nampa, Id.

[21] Appl. No.: 09/062,184

[22] Filed: Apr. 17, 1998

[51] Int. Cl.⁷ .................................................. A47G 19/08
[52] U.S. Cl. ........................................................ 211/41.17
[58] Field of Search ................................ 211/26, 41.17; 361/752, 753, 754, 759, 798

[56] References Cited

U.S. PATENT DOCUMENTS

| | | | |
|---|---|---|---|
| 3,216,580 | 11/1965 | Fricker, Jr. ............................ | 211/41.17 |
| 3,303,394 | 2/1967 | Peter et al. ....................... | 211/41.17 X |
| 3,652,899 | 3/1972 | Henschen . | |
| 3,715,630 | 2/1973 | Kuhl .................................... | 211/41.17 |
| 3,775,643 | 11/1973 | Schachnow et al. . | |
| 3,829,741 | 8/1974 | Athey . | |
| 4,046,443 | 9/1977 | Champagne . | |
| 4,477,135 | 10/1984 | Pronto .............................. | 211/41.17 X |
| 4,700,846 | 10/1987 | Schroeder ............................ | 211/41.17 |
| 4,861,277 | 8/1989 | Bina . | |
| 4,909,752 | 3/1990 | Hallum et al. .......................... | 439/325 |
| 5,145,407 | 9/1992 | Obata et al. . | |
| 5,191,514 | 3/1993 | Kabat et al. ............................ | 361/415 |
| 5,258,889 | 11/1993 | Belanger, Jr. .................... | 211/41.17 X |
| 5,594,627 | 1/1997 | Le ...................................... | 361/752 X |
| 5,829,601 | 11/1998 | Yurchenco et al. ................. | 211/41.17 |

*Primary Examiner*—Alvin Chin-Shue
*Assistant Examiner*—Sarah Purol
*Attorney, Agent, or Firm*—Clifford Chance Rogers & Wells LLP

[57] ABSTRACT

Bracket for connection to a chassis of an electronic apparatus without the use of screws is described. The bracket may feature a support arm having at least one connection means, a ledge portion connected to the top of the support arm, and a flexible section connected to the ledge portion. The flexible section may extend at an angle to the ledge portion to impart a tension force on the chassis when installed, and contains an engagement device for attachment to a chassis connection element. In a described embodiment, when installed, a protrusion of the flexible section engages a pre-existing hole in the chassis of the electronic apparatus, and the flexible section exerts a bias force against the chassis to ensure a secure connection. The bracket may also include a handle attached to the flexible section, to permit a person to disengage the engagement device of the flexible section from the chassis connection element.

35 Claims, 3 Drawing Sheets

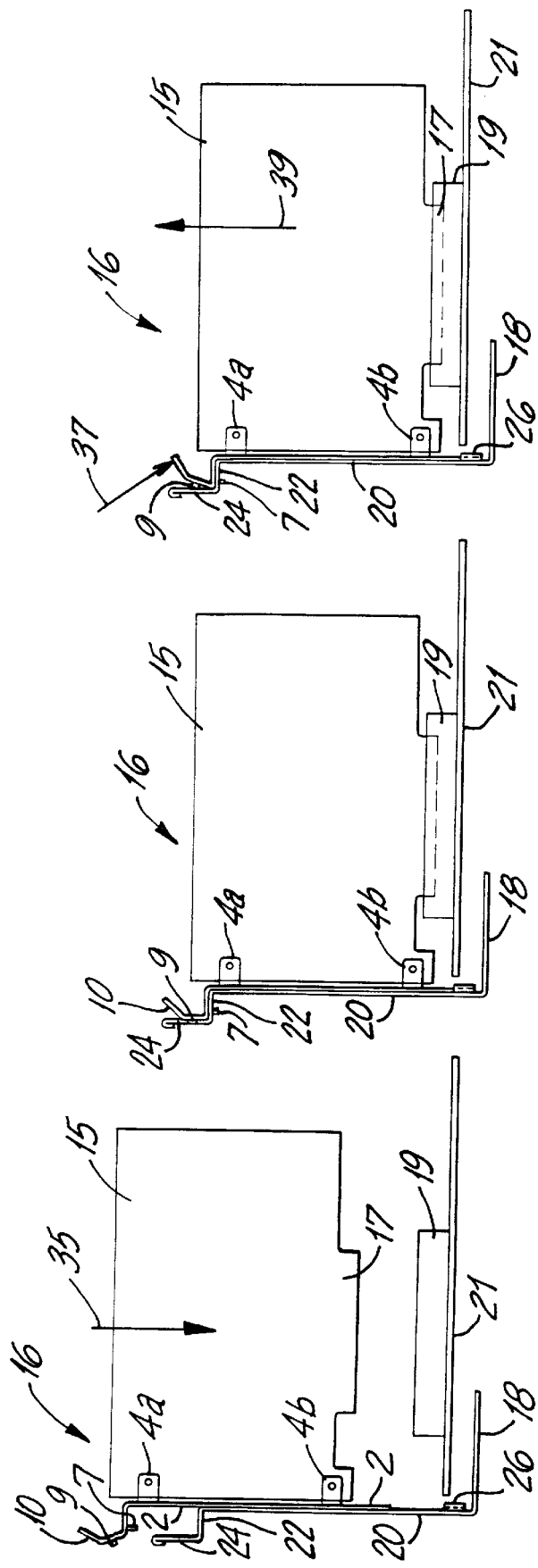

PRINTED CIRCUIT BOARD MOUNTING BRACKET

BACKGROUND OF THE INVENTION

The invention pertains to a printed circuit board mounting bracket. In particular, the bracket is designed to facilitate mounting printed circuit boards to the chassis of a personal computer without using screws.

Manufacturers of electronic equipment, such as personal computers, continuously strive to improve the methods used to assemble component parts in order to reduce costs. Printed-circuit boards (PC boards), also known as cards, must be connected to a motherboard and secured to a chassis quickly and efficiently while still ensuring good electrical connections. The PC boards include one or more integrated circuit components mounted to a stiff substrate, and conventionally include a circuit board edge connector for connection to an ISA, PCI, AGP or other connector receptacle on the motherboard.

Before final assembly of the electronic equipment, each PC board is typically mounted on a bracket. The bracket and PC board are then lowered into a chassis so that the edge connector of the PC board is inserted into a motherboard connector and holes in the bracket are aligned with pre-drilled holes in the chassis. Screws are then inserted into the holes to secure the bracket to the computer chassis. Therefore, screws and a torque drive tool are required to complete the assembly. Such installation requirements take time, which adds to manufacturing costs. Also, the use of screws makes it difficult for a consumer to later remove a PC board in order to upgrade the system or to perform a repair.

SUMMARY OF THE INVENTION

In general, a bracket for supporting a PC board in accordance with the invention connects to a chassis without the use of screws. An embodiment of the bracket includes a support arm having a top and a bottom, and at least one printed circuit board connection element. A ledge portion having a first end is connected to the top of the support arm. The invention provides a flexible section that extends at an angle to the ledge portion to impart a tension force on the chassis when installed. The flexible section includes an engaging device for attachment to a chassis connection element.

Certain implementations of the invention may include one or more of the following features. The bracket may comprise a tab element protruding from the ledge portion for engaging a pre-existing slot in the chassis. A flange may be formed at the bottom of the support arm, for engaging a holder in the chassis. In addition, a handle may be attached to the flexible section, to enable a user to disengage the engaging device from the chassis connection element. The angle of extension of the flexible portion to the ledge portion may be greater than ninety degrees.

The engaging device of the flexible section may be a protrusion, and the chassis connection element may be a pre-existing hole in the chassis. Alternately, the engaging device may be a hole in the flexible section, and the chassis connection element may be a protrusion on the chassis.

In another implementation, generally, the invention features a one-piece printed circuit board mounting bracket for connection to a chassis without the use of screws. The bracket includes a support arm having a top and bottom, and at least one printed circuit board connection means extending from the support arm. A ledge portion extends from the top of the support arm. A flexible section contains an engaging device for engaging a chassis connection element, and the flexible section extends from the ledge portion to impart a tension force on the chassis when installed.

Yet another embodiment, generally, features a bracket for connection to a chassis and to a PC board bracket assembly. The bracket includes a support arm having a top and a bottom. At least one connection element is connected to the support arm for attachment to a PC board bracket assembly. A ledge portion has a first end connected to the top of the support arm, and has a second end. A flexible section is connected to the second end of the ledge portion and includes an engaging device for attachment to a chassis connection element. The flexible section extends at an angle to the ledge portion, so that a tension force is imparted on the chassis when the bracket is installed.

A further aspect features, generally, a method for mounting a printed circuit board to a chassis without using screws. The technique includes connecting the printed circuit board to a support arm of a bracket, wherein the bracket includes a flexible member having an engaging device. The support arm of the bracket is then aligned along a chassis wall so that an edge connector of the printed circuit board aligns with a receptacle on a motherboard. In addition, the engaging device of the flexible member is aligned with a chassis connection element in the chassis. The engaging device is then engaged with the chassis connection element and the edge connector engages with the receptacle.

Certain implementations of the method according to the invention may include one or more of the following features. A tab of the bracket may be engaged with a pre-existing slot on the chassis. A flange of the bracket may be engaged with a holder inside the chassis. A handle of the bracket may be depressed to disengage the engaging device from the chassis connection element, and then the bracket and the printed circuit board may be removed from the chassis.

The use of a bracket according to an implementation of the invention reduces the total number of screws required to install PC boards into an electronic device, such as a personal computer. In addition, the bracket eliminates the need to use a torque driving tool, such as a screwdriver to install or remove the PC board. Thus, a time savings in the manufacturing process is realized. Furthermore, an engaging device, such as a protrusion, located on a pre-loaded flexible section of the bracket, snaps into the hole of the chassis upon connection. The protrusion seated in the hole provides an indication of proper connection, while the flexible section creates a restraining load on the bracket and PC board which acts to secure the board. The restraining load also ensures a tight fit and good electrical connection of the PC board to the motherboard. Furthermore, the handle attached to the flexible section of the bracket enables a consumer or assembly worker to easily remove a PC board without the use of a screwdriver or some other torque driving tool.

The details of several implementations of the invention are set forth in the accompanying drawings and the description below. Other features and advantages of the invention will be apparent from the description and the drawings, and from the claims.

BRIEF DESCRIPTION OF THE DRAWINGS

FIGS. 3A to 3C illustrate how the card assembly of FIG. 2A is connected to, and removed from, the chassis of a personal computer.

Like reference numbers and designations in the various figures denote like elements.

DETAILED DESCRIPTION

Figure 1A:
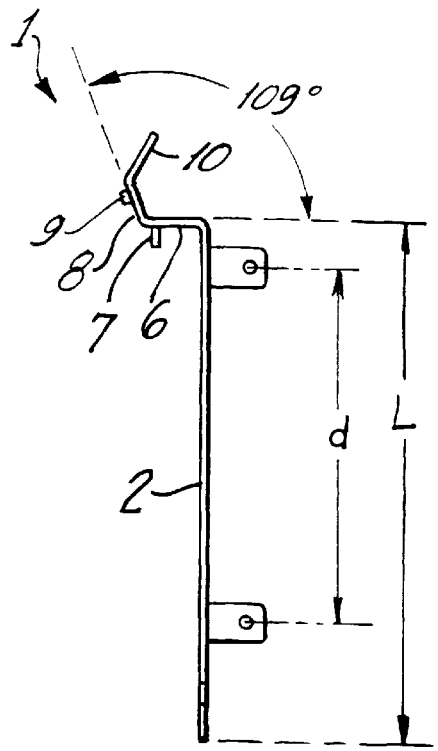
FIG. 1A is a side view of an implementation of a bracket for supporting a printed circuit board according to the invention.

FIG. 1A is a side view of an implementation of a bracket 1 for supporting a printed-circuit board (PC Board) which contains one or more integrated circuit components. The bracket 1 may be of one-piece construction and be made of a flexible metal, such as twenty-gauge zinc-plated steel. The bracket may also be made of a composite material, such as a metallized plastic, which may include a conductive material to provide adequate grounding.

Referring to FIG. 1A, a support arm section 2 contains an upper connection tab 4a and a lower connection tab 4b. The tabs 4a and 4b are spaced a distance apart "d" of approximately 3.36 inches to connect to a standard-sized PC Board. Although two connection tabs are shown, it should be understood that only one or a greater number of such connection means may be required. A ledge portion 6 extends at approximately a ninety degree angle from the top of the support arm. The ledge portion fits into a lip portion of the computer chassis (discussed below with regard to FIG. 2A) and includes a tab 7 that projects downward. Extending from the end of the ledge portion is a flexible section 8 having a protrusion 9. Extending from the end of the flexible section is a handle portion 10.

The protrusion 9 on the flexible portion 8 may be spherically shaped, and may be a dimple designed to fit into a hole on the side wall above the lip of the personal computer chassis. The protrusion 9 may have a spherical radius of approximately 12 degrees, and may be formed by pressing an auger tool into the flexible member, or may be a separately attached element. In a similar manner, the tab 7 may be rectangular in cross-section, and may be designed to fit into a slot in the chassis. Of course, instead of a protrusion and tab, the bracket 1 may contain an alternate engaging element such as slots or holes designed to accept a connection device on the chassis such as a protrusion or tab.

As shown in the implementation of FIG. 1A, in the rest position, the flexible section 8 of the bracket may be at a one-hundred and nine degree angle from the plane of the ledge portion 6. The size of the angle between the flexible section and ledge portion may be greater or less than one-hundred and nine degrees, depending on the material composition of the bracket and/or tensioning requirements. However, in most cases, this angle should be greater than ninety degrees to provide a pre-load tension force when the bracket is mounted to the chassis to ensure a secure fit, as will be explained below.

Figure 1B:
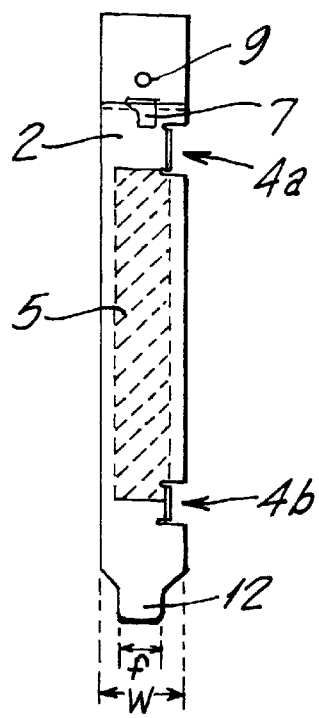
FIG. 1B is a front view of the bracket of FIG. 1A.

FIG. 1B is a front view of the bracket 1 of FIG. 1A. The width "W" of the bracket may be approximately 0.725 inches, and the length "L" of the support arm may be approximately 4.725 inches. The ledge portion 6 may be approximately 0.75 inch in length, and the tab 7 may extend from near one end of the ledge so that it will engage a slot of the chassis. The flexible section 8 may be approximately 0.5 inch long and the protrusion 9 may be positioned to engage with a hole in the chassis. These dimensions of the bracket sections correspond to those required to fit into a standard size personal computer chassis. However, one skilled in the art could easily modify the dimensions of the bracket sections to be longer or shorter, wider or thinner, so that the bracket will fit other chassis types.

Referring to FIG. 1B, the bottom end of the support arm 2 contains a flange 12. The width "f" of the flange 12 may be approximately 0.40 inches, and may be designed to fit into a holder (shown in FIG. 2B) that may be mounted within the chassis of the personal computer.

As shown in FIG. 1B, the PC Board connector tabs 4a and 4b are integral parts of the bracket 1 in this embodiment, and are approximately perpendicular to the plane of the front of the support arm. In addition, the dotted line, cross-hatched area 5 represents the approximate area occupied by the integrated circuit components of a PC board when connected to the bracket, behind the front of the support arm 2. The bracket and attached PC board can therefore be installed in the chassis without having any of the PC board components touch the chassis.

Figure 2A:
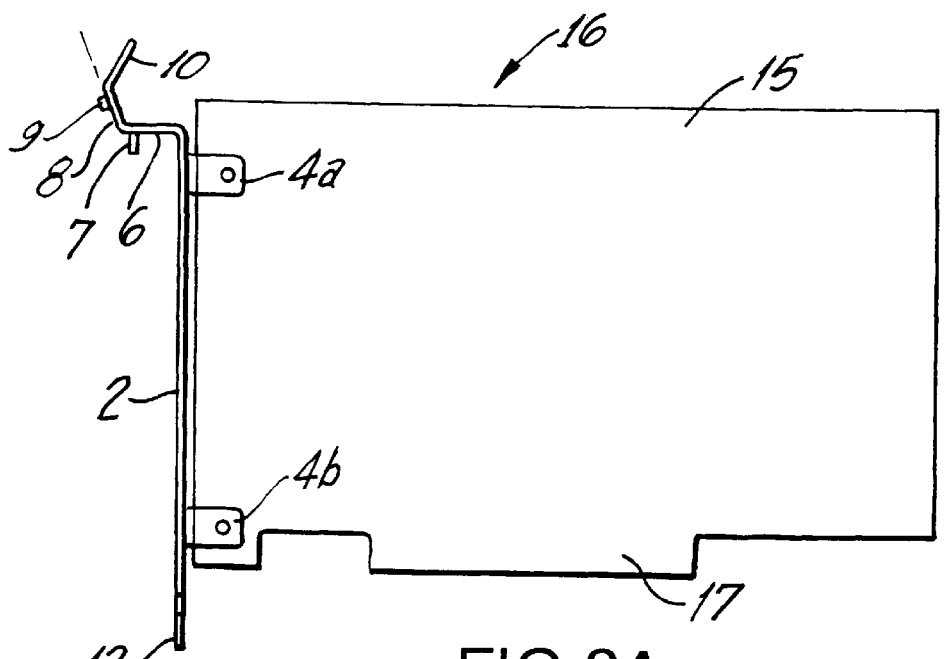
FIG. 2A is a side view of a PC board and bracket assembly according to an implementation of the invention.

FIG. 2A is a side view of a card assembly 16 which includes the bracket 1 connected to a PC Board 15 via the upper and lower tab connectors 4a and 4b. In addition to containing one or more integrated circuit components, the PC board includes a circuit board edge connector 17. The edge connector is designed to fit into a receptacle in a motherboard located inside a chassis.

Referring to FIG. 2A, a rivet or screw could be used to fasten the PC board to the tab connectors 4a and 4b of the bracket. Alternately, the PC board may contain one or more areas corresponding to the positions of the tab connectors so that an adhesive or solder connection may be formed.

Figure 2B:
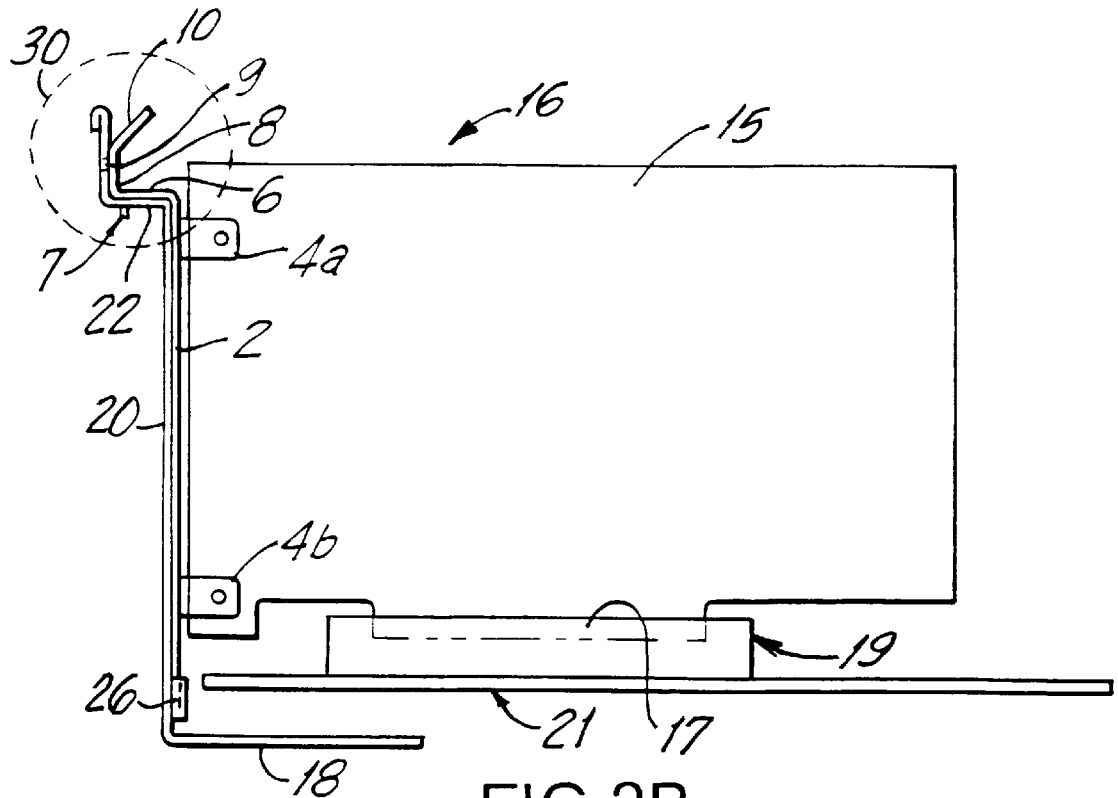
FIG. 2B is a partial cutaway side view of a personal computer chassis illustrating the mounting of the card assembly of FIG. 2A therein.

FIG. 2B is a partial cutaway side view of a personal computer chassis 18 to illustrate the mounting of a card assembly 16 therein. In the mounted position, the support arm 2 of the bracket is substantially parallel to the side wall 20 of the chassis, the tab 7 is engaged in a slot 27 of the chassis lip 22, and the protrusion 9 is seated in a screw hole 23 in chassis rim 24 (see FIG. 2C). In addition, the flange 12 of the bracket is seated in a holder 26 located in the interior of the chassis, and the PC Board edge connector 17 (shown in dotted line) is seated in a card connector receptacle 19 of the motherboard 21.

Figure 2C:
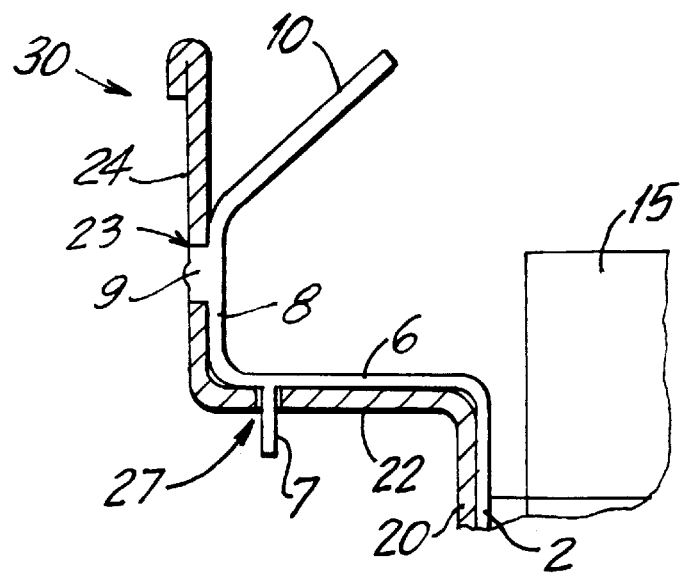
FIG. 2C is an enlarged, cutaway side view of the circular dotted-line area 30 shown in FIG. 2A.

FIG. 2C is an enlarged, cutaway view of the circular dotted-line area 30 of FIG. 2A. In particular, the detailed view 30 depicts the protrusion 9 seated in a hole 23 in the rim 24. In this location, a prior art bracket would be secured to the chassis by use of a screw. The tab 7 is seated in a slot or aperture 27 of the lip 22 of the chassis. As shown, the ledge 6 of the bracket is substantially parallel to the lip 22, and the flexible section 8 now conforms to the rim 24. However, the flexible section 8 has been forced into this position from its rest position shown in FIG. 1A, to now be in a position that it is approximately ninety degrees from the plane of the ledge portion 6. Therefore, when the protrusion 9 is seated in the hole 23, the flexible portion 8 provides a spring-like tension force against the rim 24, and also exerts a spring-like tension force causing the ledge 6 and tab 7 to press against the lip 22. In addition, a slight bias force is exerted on the support arm 2 in a direction towards the chassis side wall 20, and on the PC Board 15 in a generally downward direction. These forces may be beneficial because they promote good electrical contact between the circuit board edge connector 17 and connector receptacle 19 (see FIG. 2B).

FIGS. 3A to 3C depict how a card assembly 16 may be connected to the chassis 18 of a personal computer. In FIG.

3A, the arrow 35 depicts the insertion direction of the card assembly 16 into the chassis 18. The pre-loaded, flexible section 8 of the bracket 1 is in its rest position as the support arm 2 of the bracket is lowered to slide along the inside of chassis wall 22. As the bracket is lowered, the flexible section 8 approaches the chassis rim 24, the tab 7 approaches the aperture in the lip 22 of the chassis, the flange 12 approaches the bracket holder 26, and the PC Board edge connector 17 approaches the connector receptacle 19 of the motherboard 21. In order to better align the bracket during insertion, the inside walls of the chassis may contain channels to guide the edges of the support arm 2. When the bracket 1 reaches the position shown in FIG. 3B, the protrusion 9 of the flexible section 8 snaps into the hole in the rim 24 of the chassis, the tab 7 seats in the slot in the lip 22, and the flange 12 seats in the holder 26. The circuit board edge connector 17 also seats in the connector receptacle 19. The installer may hear an audible "snap" sound, and/or feel the protrusion 9 entering the hole in the chassis rim 24 when the bracket is correctly inserted, as well as feel the edge connector 17 enter the receptacle 19, which indicate that the bracket and PC Board have been properly aligned.

Referring to FIG. 3C, to remove the bracket and PC Board assembly, service personnel or a consumer pushes the handle 10 of the bracket 1 in a generally downward direction as shown by the arrow 37. This operation disengages the protrusion 9 from the hole 23 in the rim 24 and permits the bracket and PC Board assembly to be removed in the direction of the arrow 39. A technique for removing the assembly involves grasping the PC Board about the top connector 4a with one hand and depressing the handle 10 with the other hand so that the dimple disengages from the hole 23, and then pulling upward in the direction of arrow 39. In this manner the support arm 2 of bracket 1 slides along the inner wall of the chassis 18 as the tab 7, flange 12, and PC board connector 17 disengage from the chassis and/or their respective holders.

It should be understood that the handle 10 may not be required on a bracket according to the invention. In the absence of a handle, a tool could be used to push the protrusion of the flexible element away from the hole in the chassis or to push the flexible element away from the chassis wall. For example, in some implementations, it may be possible to use a pen or pencil to disengage the protrusion from the hole so that the bracket can be removed.

Embodiments of the-present invention have been described, and it will be understood that various modifications may be made without departing from the spirit and scope of the invention. For example, while a generally circular protrusion 9 has been shown, the protrusion may be conical or may be of other suitable shapes to fit into a pre-existing hole. Similarly, the tab and flange may be of different shapes, depending upon the slot and/or holders into which these elements are to engage.

Furthermore, while a bracket of certain dimensions has been described, the bracket may be larger or smaller depending on proposed use. Yet further, although the bracket has been depicted connected directly to a PC board, the bracket could be easily modified to connect to an already existing bracket. Such a device may contain bracket connection elements, such as clips or other connectors, to enable attachment to existing PC board and bracket assemblies. Such bracket connection elements are within the knowledge of one skilled in the art. Connection to an existing bracket may enable a manufacturer to enjoy the benefits of the present invention without having to disassemble already existing PC board and bracket assemblies.

In addition, although the described implementation of the bracket is of one-piece construction, it could be manufactured of two or more pieces. For example, a rigid, L-shaped support arm and ledge portion could be attached to a flexible member by one or more rivets or by spot welding, wherein the flexible member would include a protrusion element.

What is claimed is:

1. A printed circuit board bracket for connection to a chassis, comprising:
    a support arm having a top and a bottom;
    at least one printed circuit board connection element connected to the support arm and arranged to fasten the support arm to a printed circuit board;
    a ledge portion having a first end connected to the top of the support arm, and a second end; and
    a flexible section connected to the second end of the ledge portion and extending at an angle to impart a tension force on the chassis when installed, the flexible section including an engaging device for attachment to a chassis connection element.

2. The apparatus of claim 1, further comprising a tab protruding from the ledge portion for engaging a pre-existing slot in the chassis.

3. The apparatus of claim 1, further comprising a flange formed at the bottom of the support arm, for engaging a holder in the chassis.

4. The apparatus of claim 1, further comprising a handle attached to the flexible section.

5. The apparatus of claim 1, wherein the angle of extension of the flexible portion is greater than ninety degrees.

6. The apparatus of claim 1, wherein the engaging device is a protrusion.

7. The apparatus of claim 6, wherein the chassis connection element is a pre-existing hole in the chassis.

8. The apparatus of claim 1, wherein the engaging device is a hole.

9. The apparatus of claim 8, wherein the chassis connection element is a protrusion on the chassis.

10. A one-piece printed circuit board mounting bracket for connection to a chassis without the use of screws, comprising:
    a support arm having a top and bottom;
    at least one printed circuit board connection element arranged to fasten the printed circuit board bracket to a circuit board and extending from the support arm;
    a ledge portion extending from the top of the support arm; and
    a flexible section containing an engaging device for engaging a chassis connection element, the flexible section extending from the ledge portion to impart a tension force on the chassis when installed.

11. The apparatus of claim 10, wherein the ledge portion further comprises a tab for engaging a pre-existing slot in the chassis.

12. The apparatus of claim 10, further comprising a flange formed at the bottom of the support arm, for engaging a holder in the chassis.

13. The apparatus of claim 10, further comprising a handle attached to the flexible section.

14. The bracket of claim 10, wherein the angle of extension of the flexible section is greater than ninety degrees.

15. The apparatus of claim 10, wherein the engaging device is a protrusion.

16. The apparatus of claim 15, wherein the chassis connection element is a pre-existing hole in the chassis.

17. The apparatus of claim 10, wherein the engaging device is a hole.

18. The apparatus of claim 17, wherein the chassis connection element is a protrusion on the chassis.

19. A bracket for connection to a chassis, comprising:

a support arm having a top and a bottom;

at least one connection element connected to the support arm for attachment to a PC board bracket assembly;

a ledge portion having a first end connected to the top of the support arm and having a second end; and a flexible section connected to the second end of the ledge portion and including an engaging device for attachment to a chassis connection element, the flexible section extending at an angle to the ledge portion to impart a tension force on the chassis when the bracket is installed.

20. The apparatus of claim 19, wherein the ledge further comprises a tab for engaging a pre-existing slot in the chassis.

21. The apparatus of claim 19, further comprising a flange formed at the bottom of the support arm, for engaging a holder in the chassis.

22. The apparatus of claim 19, further comprising a handle attached to the flexible section.

23. The bracket of claim 19, wherein the angle of extension of the flexible section is greater than ninety degrees.

24. The apparatus of claim 19, wherein the engaging device is a protrusion.

25. The apparatus of claim 24, wherein the chassis connection element is a pre-existing hole in the chassis.

26. The apparatus of claim 19, wherein the engaging device is a hole.

27. The apparatus of claim 26, wherein the chassis connection element is a protrusion on the chassis.

28. A method for mounting a printed circuit board to a chassis, comprising:

fastening a support arm of a bracket along a first edge of the printed circuit board, the bracket including a flexible member having an engaging device;

aligning the support arm of the bracket fastened to the printed circuit board along a chassis wall so that an edge connector on a second edge of the printed circuit board perpendicular to the first edge of the printed circuit board aligns with a receptacle on a motherboard;

aligning the engaging device of the flexible member with a chassis connection element in the chassis; and engaging the engaging device with the chassis connection element while engaging the edge connector with the receptacle.

29. The method of claim 28, further comprising engaging a tab of the bracket with a pre-existing slot on the chassis.

30. The method of claim 28, further comprising engaging a flange of the bracket with a holder inside the chassis.

31. The method of claim 28, further comprising:

depressing a handle attached to the flexible member to disengage the engaging device from the chassis connection element; and removing the bracket and the printed circuit board from the chassis.

32. A method for mounting a printed circuit board assembly to a chassis, comprising:

fastening a chassis bracket along a first edge of the printed circuit board assembly, the chassis bracket including a flexible member having an engaging device;

aligning the fastened chassis bracket with a wall of the chassis so that an edge connector on a second edge of the printed circuit board is perpendicular to the first edge aligns with a receptacle on a motherboard;

aligning the chassis bracket engaging device with a chassis connection element in the chassis; and engaging the chassis bracket engaging device with the chassis connection element while engaging the edge connector with the receptacle.

33. The method of claim 32, further comprising engaging a tab of the chassis bracket with a pre-existing slot on the chassis.

34. The method of claim 32, further comprising engaging a flange of the chassis bracket with a holder inside the chassis.

35. The method of claim 32, further comprising:

depressing a handle of the chassis bracket to disengage the engaging device from the chassis connection element; and removing the chassis bracket and the attached printed circuit board assembly.

* * * * *